United States Patent
Minoo et al.

(10) Patent No.: US 8,339,798 B2
(45) Date of Patent: Dec. 25, 2012

(54) PRINTED CIRCUIT BOARDS WITH EMBEDDED COMPONENTS

(75) Inventors: Jahan Minoo, San Jose, CA (US); Anthony P. N. Bidmead, Los Gatos, CA (US); Michael Nikkhoo, San Jose, CA (US)

(73) Assignee: Apple Inc., Cupertino, CA (US)

( * ) Notice: Subject to any disclaimer, the term of this patent is extended or adjusted under 35 U.S.C. 154(b) by 194 days.

(21) Appl. No.: 12/832,885

(22) Filed: Jul. 8, 2010

(65) Prior Publication Data

US 2012/0008294 A1    Jan. 12, 2012

(51) Int. Cl.
*H05K 1/18* (2006.01)
*H05K 1/03* (2006.01)
*H05K 1/00* (2006.01)
*H05K 1/16* (2006.01)

(52) U.S. Cl. ........ 361/764; 361/761; 361/777; 361/781; 200/5 A; 200/5 B; 200/516

(58) Field of Classification Search .......... 361/679.02, 361/679.3, 679.15, 760–767, 784–788, 794–797; 174/254–267; 200/5 A, 6 A, 512–517, 306, 200/302.2, 292, 406, 341–345, 521; 345/156–184; 455/550.1, 575.1, 556, 556.2; 29/622
See application file for complete search history.

(56) References Cited

U.S. PATENT DOCUMENTS

| | | | | |
|---|---|---|---|---|
| 3,600,528 A * | 8/1971 | Leposavic | ..................... | 200/5 A |
| 3,684,842 A * | 8/1972 | Boulanger | ..................... | 200/5 R |
| 3,725,907 A * | 4/1973 | Boulanger | ..................... | 341/22 |
| 3,806,673 A * | 4/1974 | Boulanger | ..................... | 200/5 A |
| 3,973,091 A * | 8/1976 | Kaminski | ..................... | 200/5 A |
| 4,074,088 A * | 2/1978 | Keough et al. | ................ | 200/5 A |
| 4,127,752 A * | 11/1978 | Lowthorp | ..................... | 200/5 A |
| 4,175,816 A | 11/1979 | Burr et al. | | |
| 4,207,448 A * | 6/1980 | Furusawa et al. | ............ | 200/516 |
| 4,263,485 A * | 4/1981 | Corwin | ........................ | 200/5 A |
| 5,826,708 A | 10/1998 | Finlay | | |
| 5,986,228 A * | 11/1999 | Okamoto et al. | ............ | 200/516 |
| 6,388,218 B1 * | 5/2002 | Ando et al. | .................. | 200/512 |
| 6,518,527 B2 | 2/2003 | Watanabe et al. | | |
| 6,730,869 B2 * | 5/2004 | Teruyama et al. | ............ | 200/516 |
| 6,928,726 B2 | 8/2005 | Zollo et al. | | |
| 6,982,394 B2 * | 1/2006 | Ide et al. | ...................... | 200/516 |
| 7,094,985 B2 | 8/2006 | Kobayashi et al. | | |

(Continued)

FOREIGN PATENT DOCUMENTS

DE    3002772 C2    3/1984

(Continued)

*Primary Examiner* — Michail V Datskovskiy
(74) *Attorney, Agent, or Firm* — Treyz Law Group; G. Victor Treyz; Nancy Y. Ru

(57) ABSTRACT

Printed circuit boards are provided with embedded components. The embedded components may be mounted within recesses in the surface of a printed circuit board substrate. The printed circuit board substrate may have grooves and buried channels in which wires may be mounted. Recesses may be provided with solder pads to which the wires may be soldered or attached with conductive adhesive. An integrated switch may be provided in an opening within a printed circuit board substrate. The integrated switch may have a dome switch member that is mounted within the opening. A cover member for the switch may be formed from a flexible layer that covers the dome switch member. Terminals for the integrated switch may be formed from conductive structures in an interior printed circuit board layer. Interconnects may be used to electrically connect embedded components such as switches, integrated circuits, solder pads for wires, and other devices.

19 Claims, 21 Drawing Sheets

U.S. PATENT DOCUMENTS

| | | |
|---|---|---|
| 7,676,242 B2 | 3/2010 | Siddiqui et al. |
| 2003/0229795 A1* | 12/2003 | Kunigkeit et al. ............ 713/189 |
| 2007/0111380 A1 | 5/2007 | Cho et al. |
| 2010/0265184 A1 | 10/2010 | Jung |

FOREIGN PATENT DOCUMENTS

| | | | |
|---|---|---|---|
| JP | 2006040808 A | * | 2/2006 |
| JP | 2009193467 A | | 8/2009 |

* cited by examiner

PRINTED CIRCUIT BOARDS WITH EMBEDDED COMPONENTS

BACKGROUND

This relates to assemblies of electrical and mechanical components for electronic devices, and, more particularly, to ways in which to incorporate components into printed circuit board structures.

Electronic devices use integrated circuits and electrical components such as switches. These components are typically mounted to the surface of a printed circuit board using solder.

Printed circuit boards may be formed from substrates such as fiberglass-filled epoxy. In complex designs, multiple board layers may be laminated to form a multilayer printed circuit board.

In a typical printed circuit board arrangement, parts are attached to the surface of the outermost board layer. Vias may be formed to interconnect board layers. Some boards have included embedded microphones.

Switches and other components such as the wires are generally attached only to the surface of printed circuit boards. While this approach is sometimes acceptable, problems can arise when it is desired to form robust and compact structures. Traditional component mounting approaches may result in boards that are not sufficiently strong or that have awkwardly protruding components. Traditional approaches may also raise concerns with environmental sealing, the strength with which structures are attached to a board, and manufacturability.

It would therefore be desirable to be able to provide improved printed circuit board structures such as printed circuit board structures with embedded switches and other electrical components and improved methods for manufacturing such boards.

SUMMARY

Compact and robust electrical device accessories and other equipment may be formed using printed circuit boards with embedded components. Printed circuit board substrates may be formed from one or more layers of dielectric material. In multilayer substrates multiple printed circuit board layers may be laminated together. Conductive layers may be patterned to form interconnects. Interconnects may also be formed by drilling vias. Vias may be drilled mechanically or using laser drilling.

Embedded components may be mounted within recesses in the surface of a printed circuit board substrate and other openings. The openings may be well-shaped recesses such as square recesses that penetrate partway into the printed circuit board substrate or may have the shapes of grooves or buried channels. Switches such as tact switches may be mounted within printed circuit board substrate openings. Vias may be used to form connections to the terminals of embedded switches.

Grooves and buried channels in a printed circuit board substrate may be used to mount wires. Surface recesses and other openings may be provided with solder pads to which the wires may be soldered or attached with conductive adhesive. Adhesive may be used to seal solder pad structures.

An integrated switch may be formed in a recess within a printed circuit board substrate. The integrated switch may have a dome switch member that is mounted within the recess. A cover member for the switch may be formed from a flexible layer that covers the dome switch member. Terminals for the integrated switch may be formed from conductive structures in an interior printed circuit board layer. Interconnects that include patterned printed circuit board conductor layers and vias formed by machining and laser drilling may be used to electrically connect embedded components such as tact switches, integrated domes switches, microphones, integrated circuits, solder pads for wires, and other devices.

Further features of the invention, its nature and various advantages will be more apparent from the accompanying drawings and the following detailed description of the preferred embodiments.

DETAILED DESCRIPTION

This relates to substrates for mounting components. The substrates may be, for example, printed circuit board substrates. The components that are mounted may include electrical components such as switches and wires and may include mechanical components such as supports or housing structures. Illustrative arrangements in which electrical components are mounted using printed circuit board substrates are sometimes described herein as an example.

Components may be embedded in printed circuit board substrates by forming grooves or other recesses in the surface of a board. Components may also be embedded within the interior of a printed circuit board. Combinations of these approaches may be used if desired.

Grooves and other openings in a printed circuit board may be formed by milling or machining using drills routers or other mechanical tools or using laser machining equipment. For example, lasers may be used to drill vias in printed circuit boards.

The components that are embedded in a printed circuit board may include switches, wires, integrated circuits, connectors, microphones, speakers, light-emitting diodes and other components that can serve as displays and status indicators, or other suitable structures and electrical components. Configurations in which components such as switches, wires, integrated circuits, and microphones are embedded in printed circuit boards are sometimes described herein as an example. This is merely illustrative. Any suitable components may be embedded in a printed circuit board if desired.

Printed circuit boards in which components have been embedded may be used in electronic devices such as desktop computers, portable computers, cellular telephones, media players, televisions, displays, headsets, adapters, cables, speakers, radios, and other suitable equipment and accessories. When used in devices of these types, the use of an embedded component arrangement may help save space, may help allow board dimensions to be adjusted to satisfy design constraints (e.g., to increase board thickness without unnecessarily increasing the overall height of a printed circuit board assembly, to decrease board thickness, etc.), may improve environmental sealing, may improve structural strength, etc. Manufacturability may also be enhanced (e.g., by allowing more components to be assembled in an integrated fashion, thereby reducing part counts).

Figure 1:
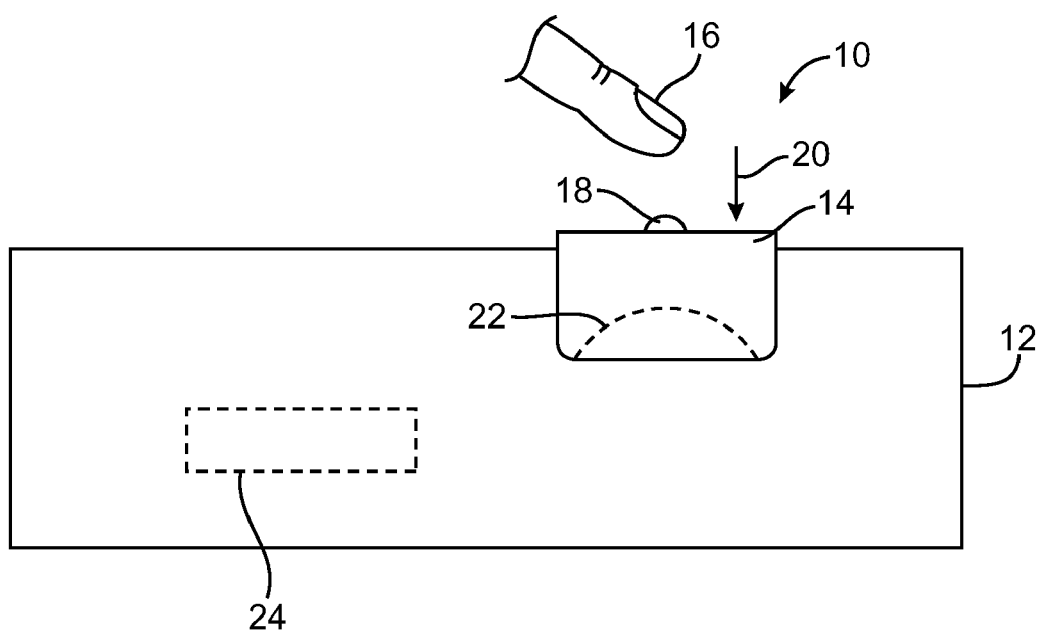
FIG. 1 is a cross-sectional side view of an illustrative printed circuit board containing an embedded switch in accordance with the embodiment of the present invention.

A cross-sectional side view of an illustrative printed circuit board with embedded components is shown in FIG. 1. In the example of FIG. 1, switch 14 and integrated circuit 24 have been embedded within printed circuit board 12. Printed circuit board 12 may contain one or more layers. Components that are embedded within printed circuit board 12 may be embedded within an interior cavity of board 12 or may be embedded in a board recess (i.e., an opening that penetrates only partway into board 12). Integrated circuit 12 represents an example of a component that is embedded within an internal cavity in board 12. Switch 14 represents an example of a component embedded in a recess in board 12.

As shown in FIG. 1, switch 14 may be a packaged dome switch having a housing that encloses dome switch member 22. This type of packaged dome switch is sometimes referred to as a "tact" (tactile) switch. Other types of switches may be embedded within printed circuit boards if desired. Switch 14 may have a structure such as structure 18 that a user may actuate with the tip of finger 16 or other external object. When finger 16 is pressed downwards in direction 20, member 18 may move downwards to compress domes switch member 22 and thereby close switch 14.

The recesses in which components such as switch 14 are mounted may have the shapes of circles, squares, elongated groove-like shapes, etc. Interior openings (buried cavities) in board 12 may be cube-shaped or may have other suitable shapes. In some arrangements, more complex openings in printed circuit board 12 may be formed. For example, grooves, via-shaped recesses, interior cavities, and other openings may be combined to help attach and mount more complex structures such as wires or components that require venting (e.g., microphones and speakers).

Printed circuit board 12 may include one or more layers of dielectric and one or more layers of conductor. Typical printed circuit boards may have core layers that are formed from dielectrics. Examples of suitable materials that may be used in forming a printed circuit board include dielectrics such as fiberglass-filled epoxy (e.g., in a rigid printed circuit board) and polyimide (e.g., in a flexible printed circuit board of the type sometimes referred to as a flex circuit). For example, printed circuit boards may be formed from FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (woven glass and epoxy), CEM-4 (woven glass and epoxy), CEM-5 (woven glass and polyester), paper impregnated with phonolic resin, polystyrene, polyimide, polytetrafluoroethylene (PTFE), plastic, other polymers, ceramics, or other suitable dielectrics.

In multilayer printed circuit boards, core layers may be attached to each other using attachment layers such as layers of prepreg (i.e., pre-impregnated layers of fiber and resin). Layers of copper or other conductive materials may be formed on the surfaces of the printed circuit board core layers and prepreg layers. For example, a core layer may have upper and lower surfaces that are covered with a layer of metal such as copper.

Figure 2:
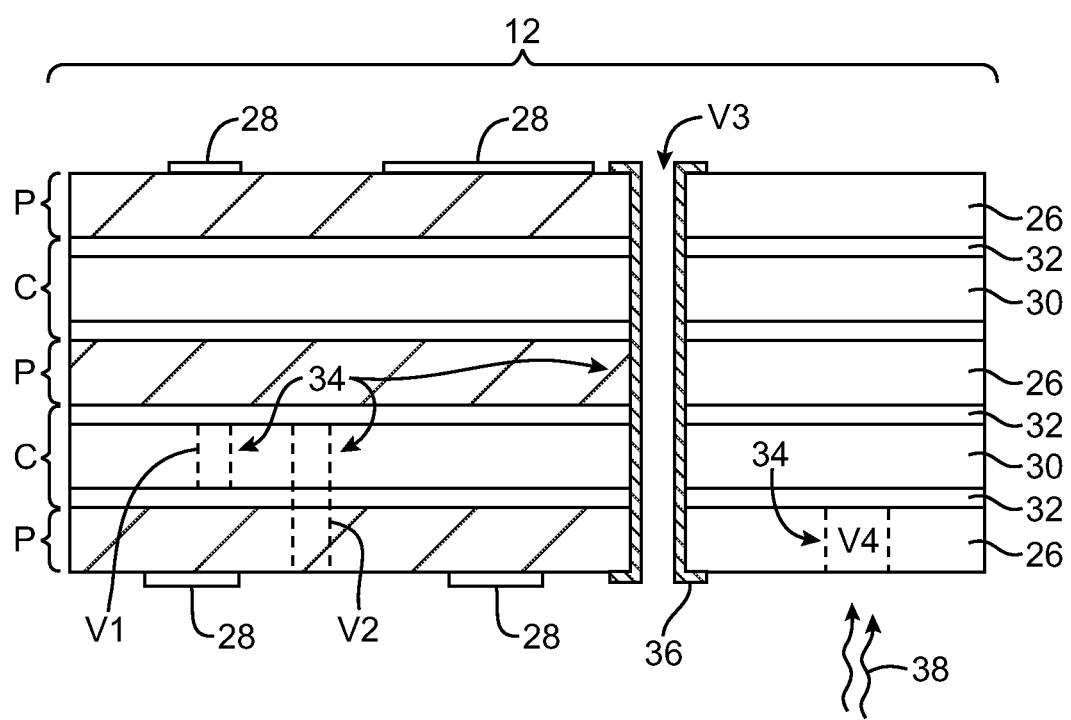
FIG. 2 is a cross-sectional side view of an illustrative printed circuit board showing how the printed circuit board may be provided with vias of different types to interconnect components and printed circuit board layers in accordance with an embodiment of the present invention.

A cross-sectional side view of printed circuit board 12 showing how board 12 may be formed from multiple printed circuit board core layers C alternated with interposed layers of prepreg P is shown in FIG. 2. The core layers may be attached to the prepreg layer and to each other by curing the prepreg (e.g., by application of heat and pressure while the layers are in proper lateral alignment).

As shown in the example of FIG. 2, printed circuit board 2 may include multiple printed circuit core layers C each of which includes a printed circuit board core dielectric layer 30 (e.g., FR4) interposed between respective upper and lower metal layers 32 (e.g., layers of copper on the surfaces of core 30). Each prepreg layer P may include prepreg dielectric 26. The exposed upper and lower surfaces of board 12 (i.e., the upper surface of the upper most prepreg layer P and the lower surface of the bottommost prepreg layer P in the orientation of FIG. 2) may be coated with patterned conductor (e.g., patterned metal 28). Other layups may be used if desired. The number of layers and the makeup of the layers in printed circuit board 12 of FIG. 2 is merely illustrative.

The metal layers of printed circuit board such as layers 28 and 32 may be patterned using photolithography, laser etching, foil stamping, screen printing, pad printing, shadow masking, or other suitable conductor patterning techniques. In a typical scenario, copper layers 32 may be patterned by screen printing a masking layer onto the surface of each layer, etching to remove unprotected metal, and removing the masking layer. The patterned conductive material of layers 28 and 32 may be used to form signal lines, contact pads, and other conductive structures. These structures, which are sometimes collectively referred to as interconnects, may be formed on the upper surface and lower surface of board 12 and in interior layers of board 12.

Vertical conductive structures called vias may be used to electrically connect layers of interconnects in board 12. As shown in FIG. 2, different types of vias 34 may be formed in board 12.

Vias such as via V1 that are contained entirely within the interior of board 12 and that do not make direct electrical connection to the outside layers of board 12 are sometimes referred to as buried vias. In the example of FIG. 2, buried via V1 is used to connect the upper and lower copper layers on the lowermost core layer C of board 12.

Vias such as via V2 that are used to connect conductive structures on an exterior surface of board 12 to an interior conductive layer in board 12 are sometimes referred to as blind vias. In the example of FIG. 2, blind via V2 is used to connect the lowermost surface of board 12 to one of the copper layers on the lowermost core layer in board 12. Vias such as via V3 that pass through the entire thickness of board 12 are sometimes referred to as through vias. As shown in FIG. 2, via V3 (and the other vias 34 in board 12) may be coated with an interior conductive layer such as plated copper layer 36. As illustrated by laser beam 38 and laser-drilled via V4, vias 34 can be formed by laser drilling. Vias can also be formed using mechanical drilling (i.e., with a drill bit) or other mechanical machining techniques. Via holes may be filled using metal (e.g., copper) plating techniques, by filling a via hole with conductive paste, by filling a via hole with conductive adhesive, or by filling a via hole with other conductive material.

Figure 3:
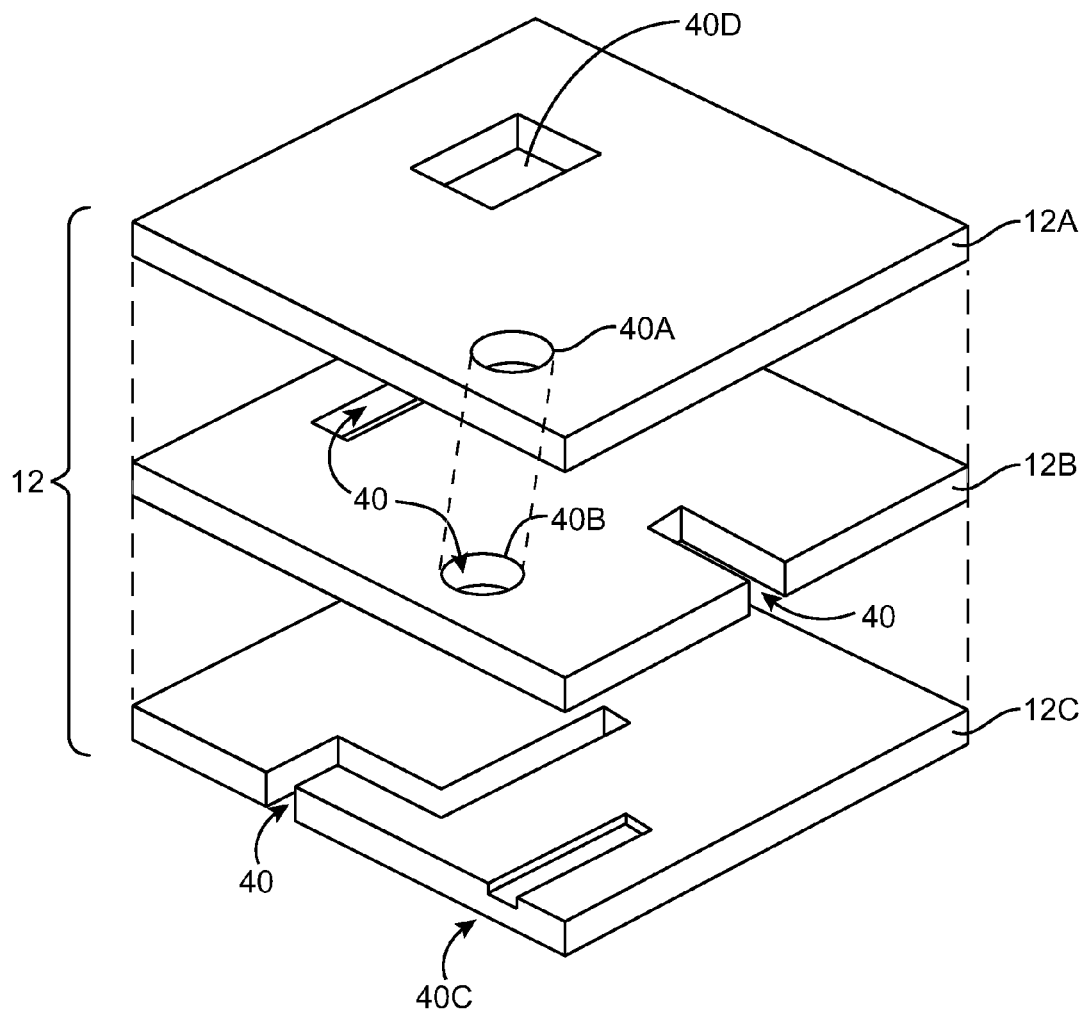
FIG. 3 is an exploded perspective view of an illustrative printed circuit board showing how layers of the printed circuit board may be provided with holes, slots, and other openings to accommodate embedded components in accordance with an embodiment of the present invention.

To accommodate components of different shapes and sizes, it may be desirable to form a variety of different openings in the materials that make up printed circuit board 12. These openings may take the form of squares, rectangles, circles, shapes with curved and straight sides, elongated groove-like and slot-like shapes, etc. A perspective view of a printed circuit board showing some of the types of openings that may be formed in the layers of the printed circuit board is shown in FIG. 3. As shown in FIG. 3, printed circuit board 12 may include multiple layers such as layers 12A, 12B, and 12C. Only three layers are shown in FIG. 3, but, in general, board 12 may have any suitable number of layers (e.g., one layer, two layers, three layers, four layers, more than four layers, more than twenty layers, fewer than twenty layers, etc.). Layers 12A, 12B, and 12C may, for example, be alternating layers of prepreg and core material (e.g., FR4) or other suitable dielectric layers and may have associated patterned metal layers for forming interconnects. The metal layers are not shown in FIG. 3 to avoid over-complicating the drawing.

Openings 40 may be formed in layers 12A, 12B, and 12C. Openings 40 may pass completely through the layer in which they are formed (see, for example, square opening 40D, which passes completely through layer 12A) or may be provided in the form of recesses that pass only partway through a layer (see, for example, groove 40C, which passes through the upper half of layer 12C, but which does not pass through the lower half of layer 12C). To accommodate components that require openings through more than one layer, openings in respective layers can be aligned and stacked one on top of the next (see, for example, laterally aligned openings 40A and 40B, which are formed in adjacent layers 12A and 12B). When printed circuit board 12 is formed by laminating layers 12A, 12B, and 12C together, openings 40A and 40B will combine to form a larger opening (i.e., an opening with a larger vertical dimension) than would be possible by forming a hole in a single one of these layers.

The components that are embedded in printed circuit board 12 may be stand-alone components. For example, components such as packaged integrated circuit die and packaged switches may be embedded in board 12. The components that are embedded in printed circuit board 12 may also be fabricated using an integrated approach (i.e., by forming parts of the housing for the components from the printed circuit board material itself).

Figure 4:
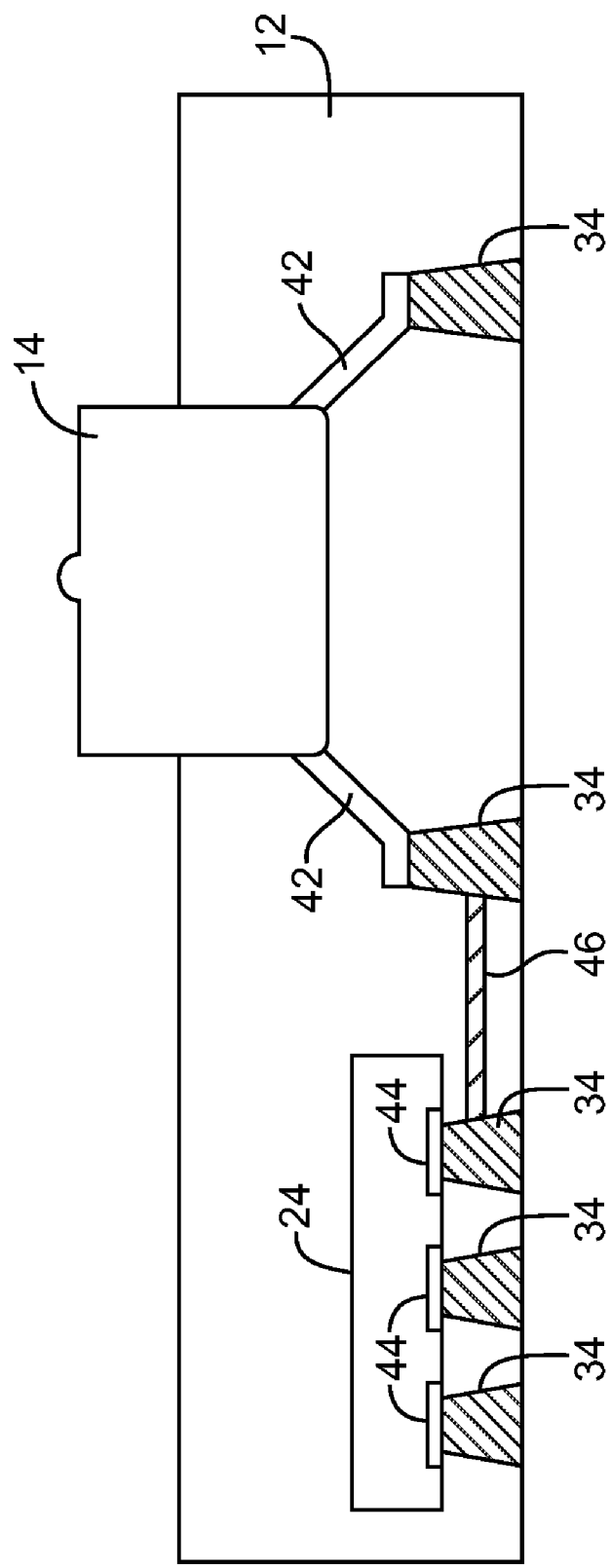
FIG. 4 is a cross-sectional side view of an illustrative printed circuit board in which a packaged switch and an integrated circuit have been embedded in accordance with an embodiment of the present invention.

An example of an arrangement that involves the mounting of stand-alone components is shown in FIG. 4. As shown in FIG. 4, tact switch 14 may be embedded in a recess in printed circuit board 12 and integrated circuit 24 may be mounted in an internal cavity in printed circuit board 12. Tact switch 14 may have conductive terminals (leads) 42. Vias 34 such as laser-drilled vias or other vias may be used to form electrical connections to terminals 42 and contact pads 44 on integrated circuit 24. Interconnects such as interconnects 46 may be used to form electrical routing pathways for printed circuit board 12 (e.g., to interconnect metal structures such as contacts 44, vias 34, and terminals 42).

Integrated circuit 24 may be a microprocessor, a microcontroller, an audio chip, an application-specific integrated circuit, or other integrated circuit. If desired, discrete electrical components (e.g., resistors, inductors, capacitors, and transistors) may be mounted in internal cavities in printed circuit board 12 or multiple integrated circuits may be mounted in internal cavities in printed circuit board 12. Different types of stand-alone components may also be embedded in printed circuit board 12 if desired. The example of FIG. 4 is merely illustrative.

Figure 5:
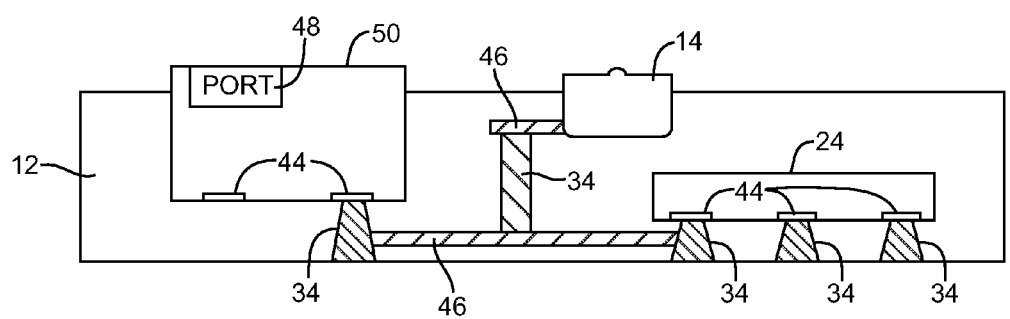
FIG. 5 is a cross-sectional side view of a printed circuit board with embedded components such as a top-vented microphone, a switch, and an integrated circuit in accordance with an embodiment of the present invention.
Figure 6:
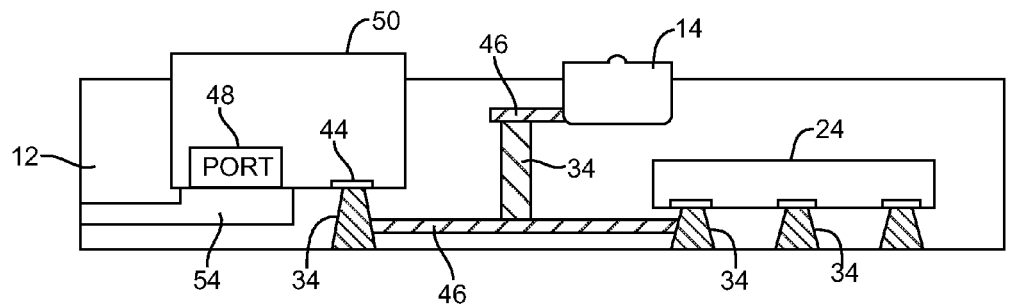
FIG. 6 is a cross-sectional side view of a printed circuit board with embedded components such as a bottom-vented microphone, a switch, and an integrated circuit in accordance with an embodiment of the present invention.

As shown in FIG. 5, components such as microphones (e.g., microphone 50) may be embedded in printed circuit board 12 with other components such as switch 14 and integrated circuit 24. Interconnects such as horizontal interconnect structures 46 and vias 34 may be used to interconnect terminals 44 on microphone 50 with terminals 44 on integrated circuit and terminals on switch 14. Microphone 50 may have an input port such a microphone port 48 that receives sound from the ambient environment. As shown in FIG. 6, a channel such as acoustic channel 54 may be formed in printed circuit board 12. This type of acoustic microphone channel arrangement (which is used in some conventional printed circuit boards to form microphone ports) may be used in board 12 to allow sound to exit from a speaker or other acoustic component or may be used to allow sound to reach a microphone.

In the FIG. 6 example, microphone 50 has been mounted port-side down. If desired, microphone 50 may be mounted port-side up (FIG. 5) or may have other orientations. Speakers (e.g., audio-quality speakers or buzzers or other sound-generating components that are embedded within board 12) may be provided with one or more acoustic channels such as channel 54 that couple the input-output port of the speaker or other acoustic component to the exterior surface of printed circuit board 12.

Figure 7:
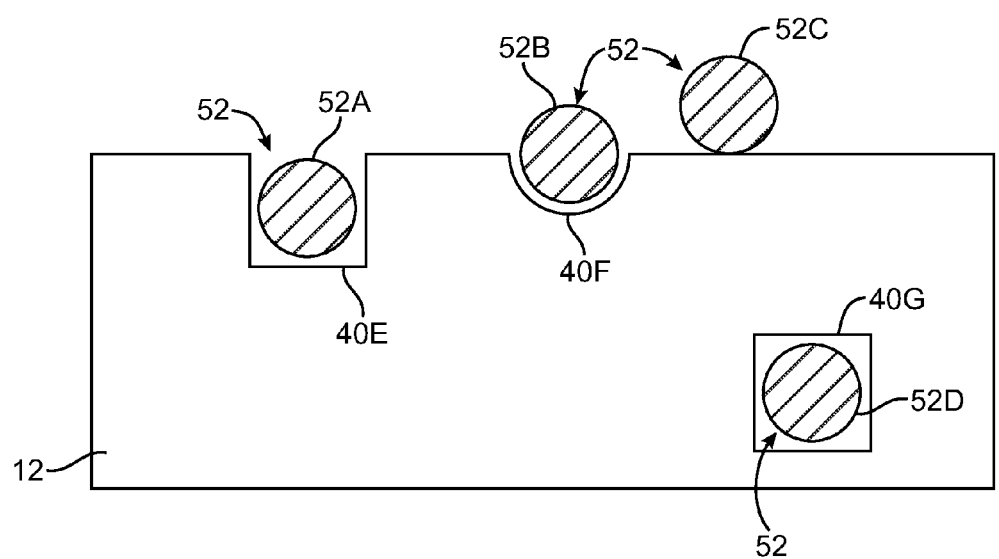
FIG. 7 is a cross-sectional side view of a printed circuit board showing how wires may be connected to the printed circuit board using different arrangements in accordance with an embodiment of the present invention.

Some types of electrical equipment include wires. Wires may be used, for example, to connect a battery to power terminals or to connect headphone speakers to an integrated circuit. To accommodate designs such as these, printed circuit board 12 may be provided with wire openings that receive wires. A cross-sectional view of an illustrative printed circuit board showing different ways in which wires 52 may be mounted to printed circuit board 12 are shown in FIG. 7.

Wires 52 may be insulated wires (e.g., wires that are coated with plastic or other insulating material along at least some of their length) or may uncoated (bare) wires. Wires 52 may be formed from solid metal (e.g., solid copper) or may be formed from intertwined filaments of metal (e.g., copper strands).

Wires 52 may have ends that are soldered to solder pads formed on the outermost surface of printed circuit board 12 or to solder pads that are formed within openings in printed circuit board 12 (e.g., on the bottom surfaces of recess that penetrate only partway through board 12). The solder pads may be planar pads that are formed from square planar conductive contact pad structures or may be formed from contact pad structures of other suitable shapes.

Before reaching a solder pad, a wire may run along the surface of printed circuit board 12 (as illustrated by wire 52C in the FIG. 7 example), may be routed through an interior opening in board 12 (as with wire 52D, which is routed through tunnel 40G), or may be routed within a recess (as with wire 52A in square-shaped recess 40E and wire 52B in rounded recess 40F). Combinations of these arrangements may also be used. Moreover, recess-shaped openings such as grooves 40E and 40F and tunnel-shaped openings such as internal cavity 40G may run vertically or diagonally as well as horizontally. Adhesive, portions of printed circuit board layers, clamps, solder, welds, fasteners, connectors, and other suitable supporting structures may be used to help hold wires 52 in place on printed circuit board 12.

Figure 8:
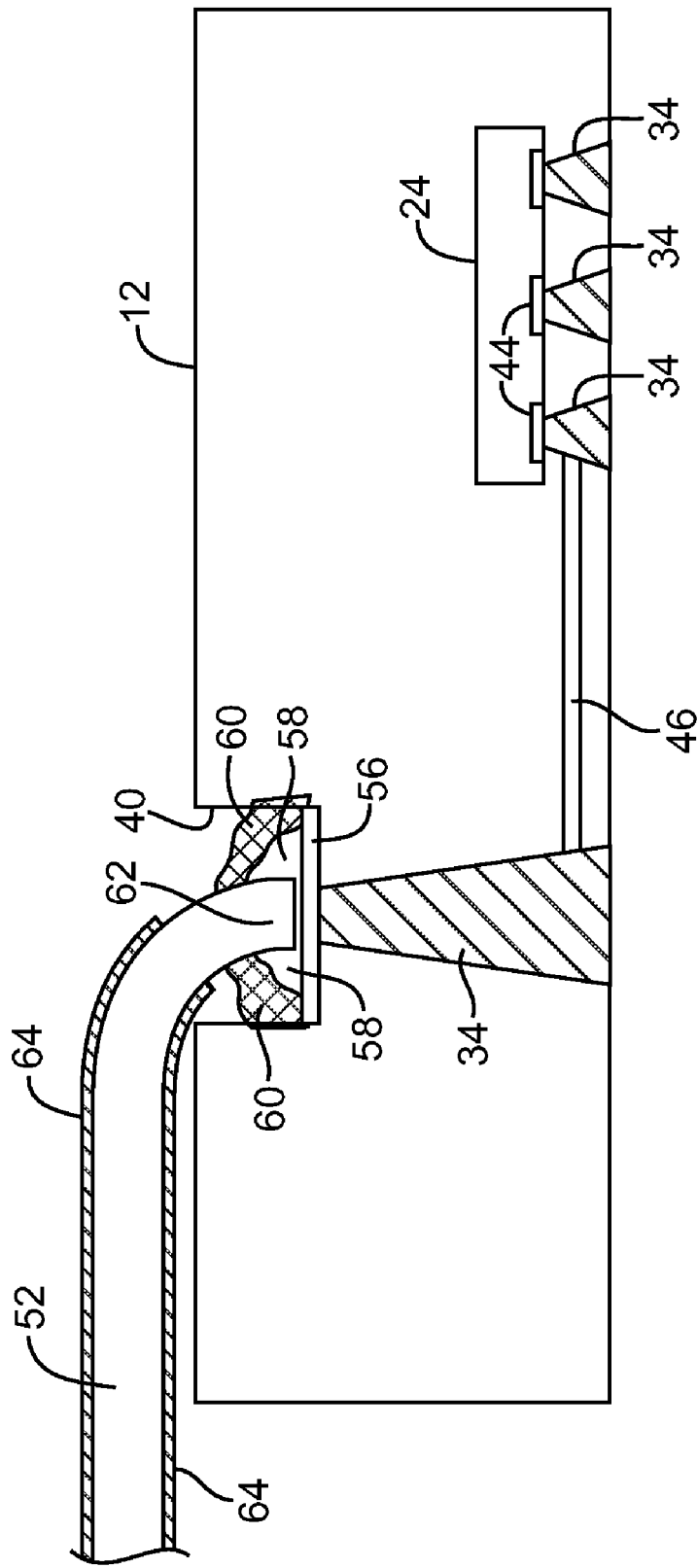
FIG. 8 is a cross-sectional side view of an illustrative printed circuit board showing how a wire that runs along the surface of the printed circuit board may be attached to the printed circuit board using a recessed solder pad in accordance with an embodiment of the present invention.

FIG. 8 is a cross-sectional side view of a printed circuit board showing how a wire that runs along the surface of the printed circuit board may be connected to interconnect structures in the board using a recessed solder pad. As shown in FIG. 8, wire 52 may have an insulating coating 64. End 62 may be uncoated with insulating coating 64, to facilitate formation of a solder connection with solder pad 56. Solder pads such as solder pad 56, which may sometimes be referred to as contacts, contact pads, or interconnect structures, may be formed from patterned conductor layers in printed circuit board 12 (e.g., layers such as layers 32 of FIG. 2) or other suitable conductive structures. Solder pads 56 may, for example, be formed form copper or copper plated with gold or other materials. Solder pads 56 may be electrically connected to the interconnects of printed circuit board 12 (e.g., using vias such as vias 34, using parts of horizontal interconnects 46, etc.).

During solder attachment, tip 62 of wire 52 may be soldered to solder pad 56 using solder 58. Adhesive 60 such as ultraviolet (UV) glue (e.g., UV-cured epoxy) may be used to seal solder 58. In a given printed circuit board 12, numerous openings 40 may be formed with the open-top well shape of FIG. 8, each of which may receive a respective wire 52. This helps improve isolation between respective solder pads 56 on board 12. The use of recesses such a recess 40 of FIG. 8 also allows adhesive 60 to be used to help hold wire 52 in place. As shown in FIG. 8, adhesive 60 may bind to the inner surfaces of recess 40 (e.g., the sidewalls of recess 40 in the FIG. 8 example), which helps attach wire 52 to printed circuit board 12 and relieves stress from solder 58. The presence of the sidewalls of well 40 laterally confines adhesive 60 and prevents adhesive 60 from interfering with adjacent structures.

Figure 9:
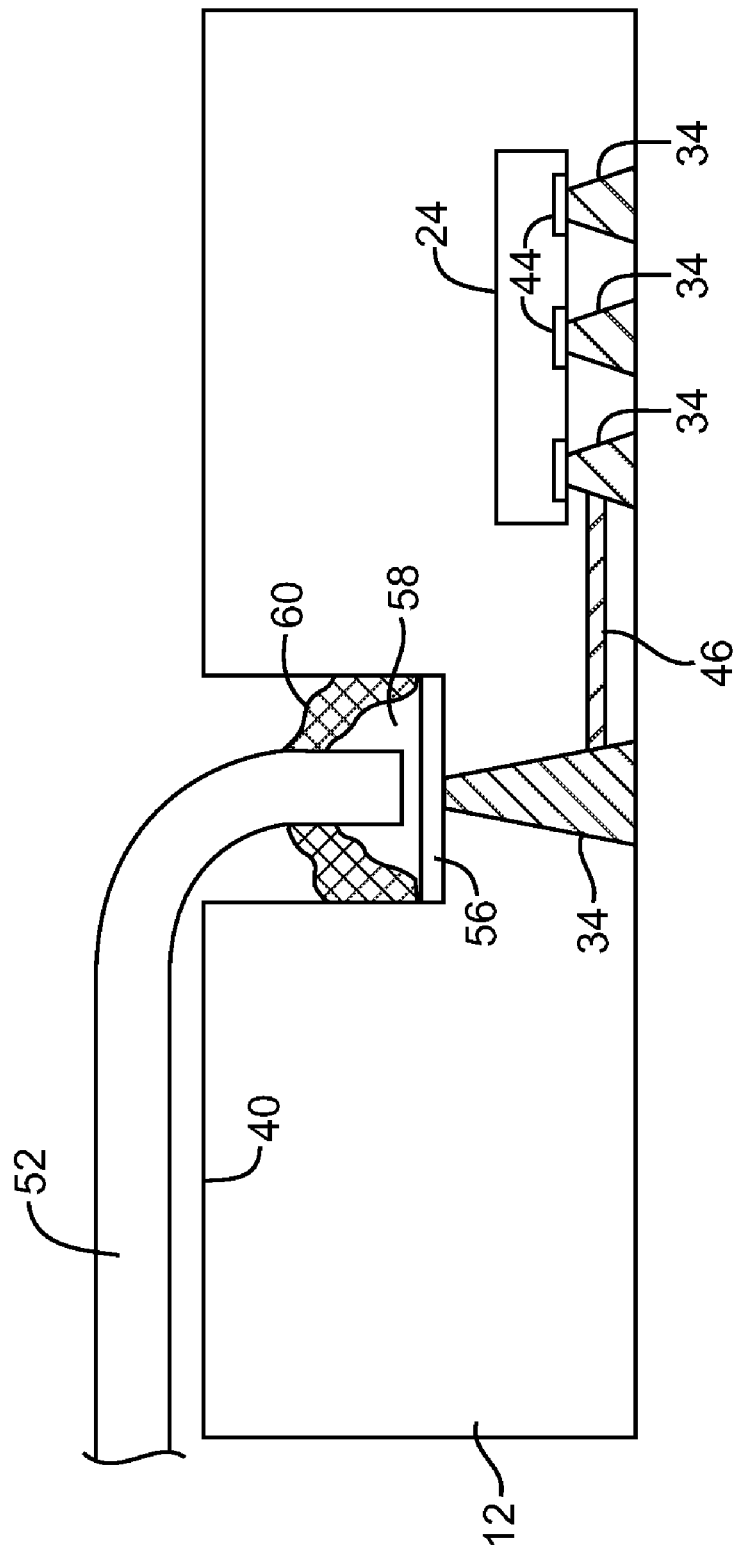
FIG. 9 is a cross-sectional side view of an illustrative printed circuit board showing how a wire that is partly recessed in the board using a groove in the upper surface of the board may be attached to the printed circuit board using a recessed solder pad in accordance with an embodiment of the present invention.

In the illustrative arrangement of FIG. 9, wire 52 has been routed within a groove-shaped opening. Groove shaped opening 40 may, for example, have a profile of the type shown by recess 40E or recess 40F of FIG. 7. The depth of groove 40 may be relatively deep so that none of wire 52 protrudes above the top surface of printed circuit board 12 (as with wire 52A in groove 40E of FIG. 7) or may be relatively shallow so that some of wire 52 protrudes above the top surface of printed circuit board 12 (as with wire 52B in groove 40F of FIG. 7).

Figure 10:
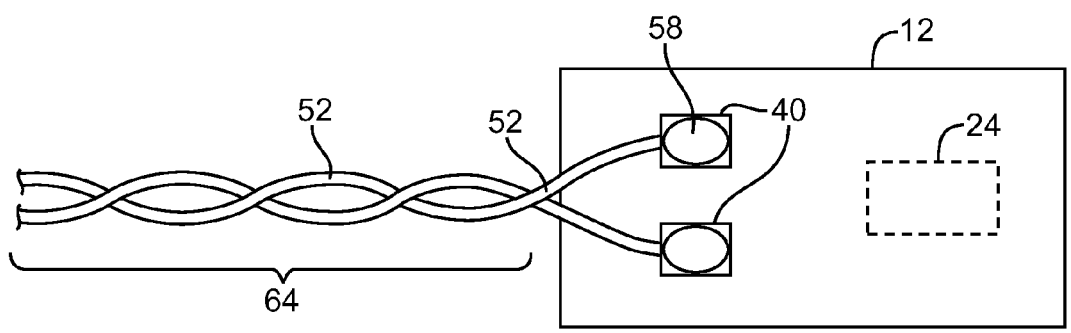
FIG. 10 is top view of an illustrative printed circuit board showing how a wire that runs along the surface of the printed circuit board or that is partly recessed in a groove in the surface of the printed circuit board may be attached to the printed circuit board using a recessed solder pad in accordance with an embodiment of the present invention.

As shown in the top view of printed circuit board 12 of FIG. 10, wires 52 may form part of a wire bundle such as wire bundle 64. Wire bundle 64 may, for example, include twisted wires 52 and, if desired, strengthening fibers and ground shielding housed within a plastic cable jacket. Wires 52 in the example of FIG. 10 may be routed along the top surface of printed circuit board 12 or may be routed within grooves 40 such as grooves 40E and 40F of FIG. 7.

Figure 11:
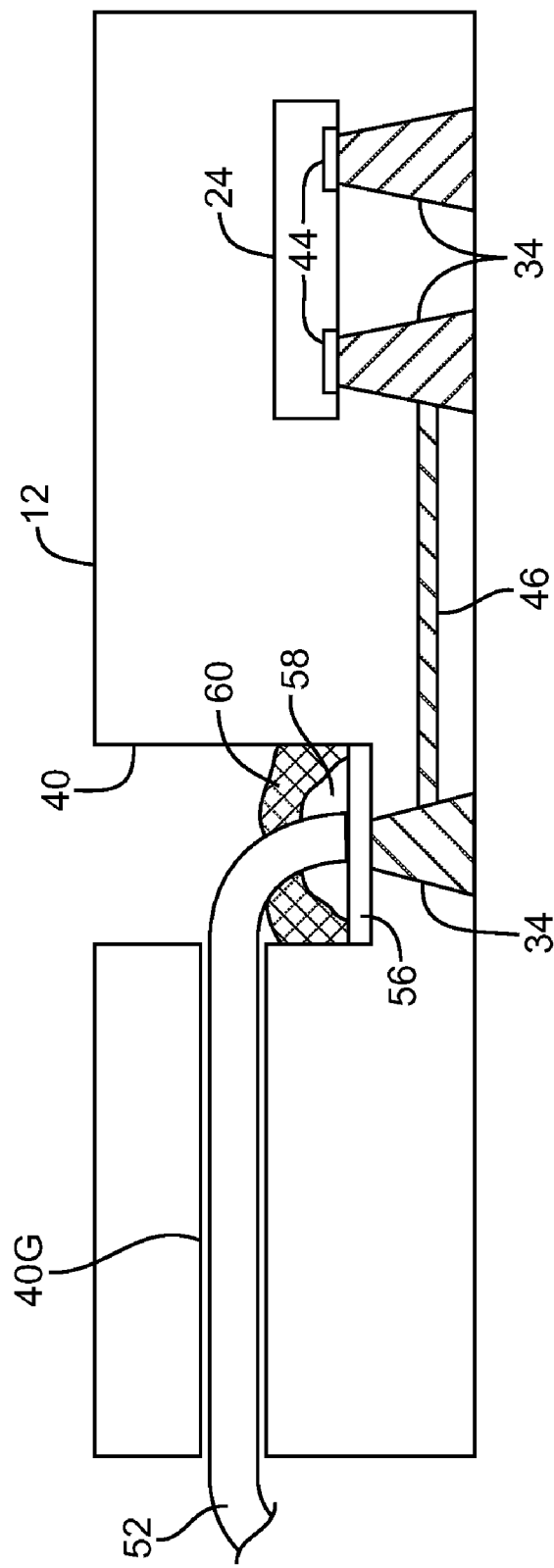
FIG. 11 is a cross-sectional side view of an illustrative printed circuit board showing how a wire that is routed through an interior cavity in the printed circuit board may be attached to the printed circuit board using a recessed solder pad in accordance with an embodiment of the present invention.

FIG. 11 is a cross-sectional side view of printed circuit board 12 showing how wire 52 may be routed to recessed solder pad 56 using buried channel 40G in printed circuit board 12 (i.e., using a tunnel).

Figure 12:
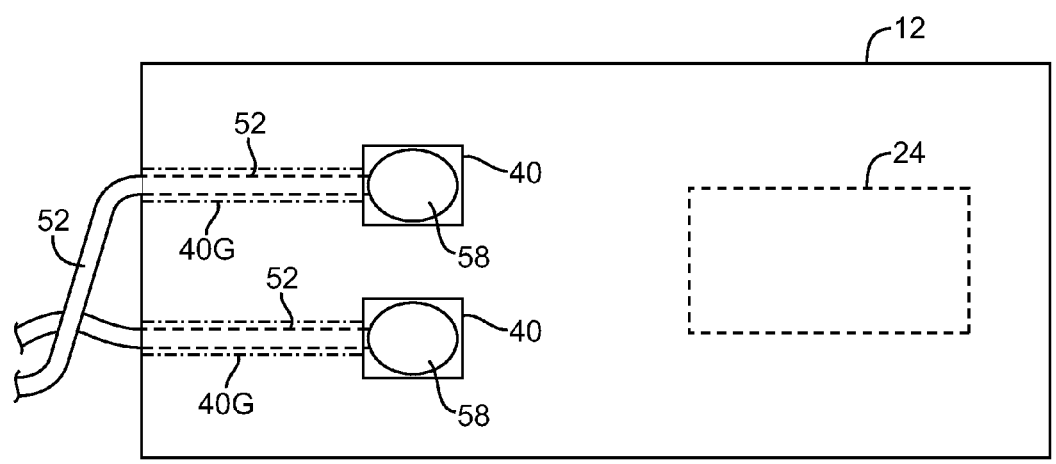
FIG. 12 is a top view of a printed circuit board that has fully embedded wires of the type shown in FIG. 11 in accordance with an embodiment of the present invention.

FIG. 12 is a top view of a printed circuit board structure of the type shown in FIG. 11. As shown in FIG. 12, wires 52 may be routed through buried channels 40G and may be attached at their ends to solder pads 56 (FIG. 11) using solder 58 (and adhesive 60, as shown in FIG. 11). Wires 52 may be placed in channels 40G after channels 40G have been formed (e.g., by inserting each wire 52 into channel 40G through the opening formed where channel 40G exits the sidewall of printed circuit board 12) or may be formed by placing wire 52 into a groove-shaped opening in board 12 and, once wire 52 is in place, covering wire 52 and groove 40G with a covering layer of printed circuit board material.

If desired, conductive adhesive or other conductive materials may be used in forming solder joint 58 (e.g., conductive paste, etc.).

Figure 13:
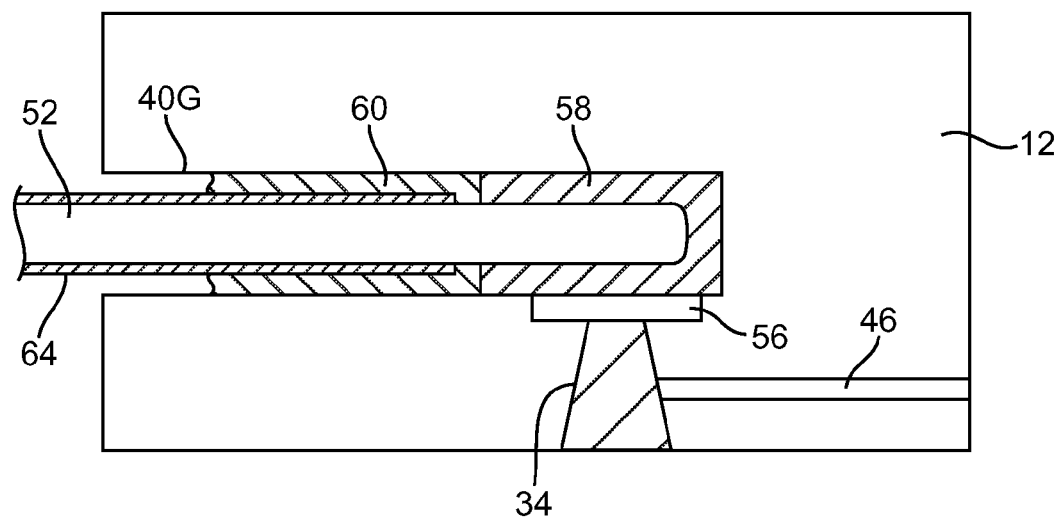
FIG. 13 is a cross-sectional side view of an illustrative printed circuit board showing how a wire may be connected to a contact pad located in the interior of the printed circuit board in accordance with an embodiment of the present invention.
Figure 14:
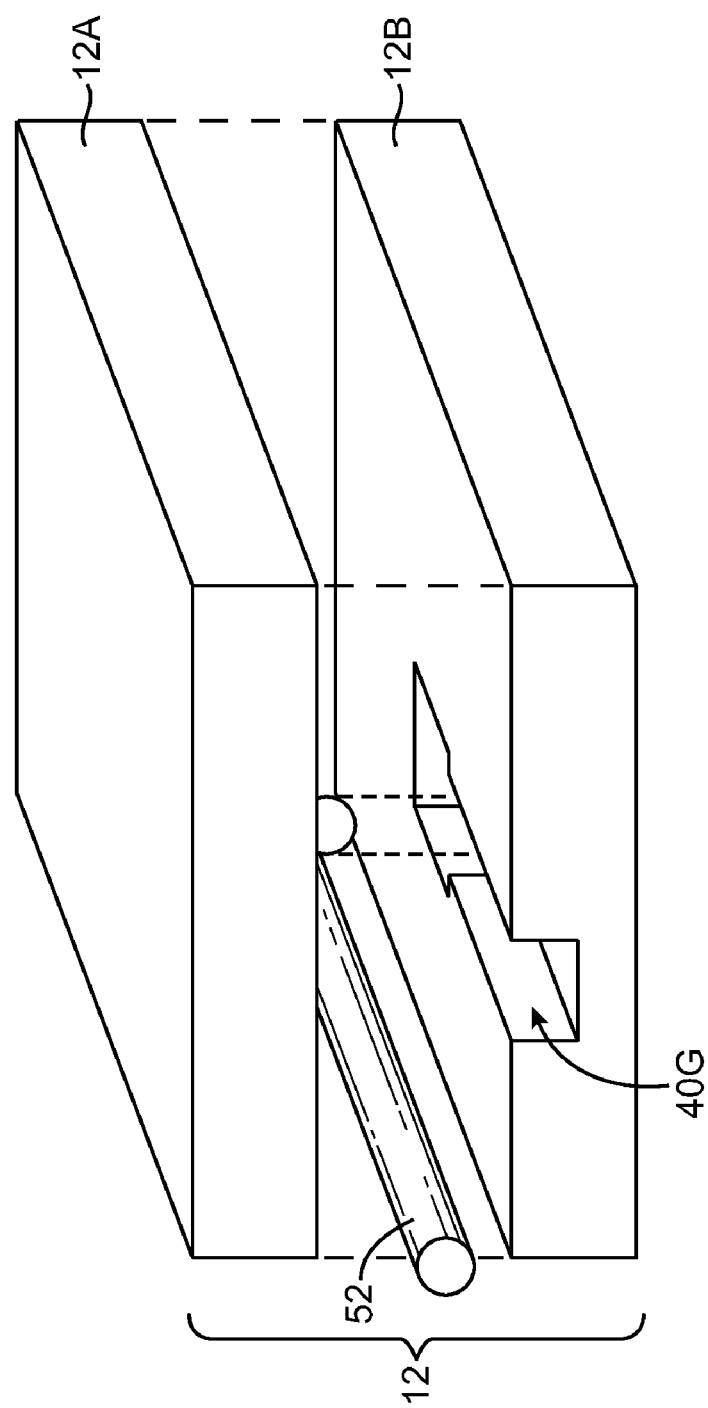
FIG. 14 is an exploded perspective view showing how a wire may be embedded within a printed circuit board in accordance with an embodiment of the present invention.

FIG. 13 is a side view of an illustrative printed circuit board showing how wire 52 may be connected to contact pad 56 using conductive adhesive 58. Adhesive 60 (e.g., UV glue) may be used to help secure wire 52 in buried channel 40G. Solder pad (contact pad) 56 need not be formed at the bottom of an open well structure (as with the example of FIG. 11), but rather may be formed in an interior cavity in board 12. Wire 52, conductive material 58 and adhesive 60 may be inserted into channel 40G before channel 40G is laminated with covering layers of printed circuit board 12 or may be inserted into channel 40G after printed circuit board 12 has been formed. FIG. 14 is a perspective view of wire 52 in a configuration in which buried channel 40G is formed from a groove-shaped recess in layer 12B that is enclosed by covering wire 52 and recess 40G with upper printed circuit board layer 12A. If desired, channels such as buried channel 40G may be formed entirely within a single layer of printed circuit board material (e.g., by using horizontal mechanical or laser drilling).

Figure 15:
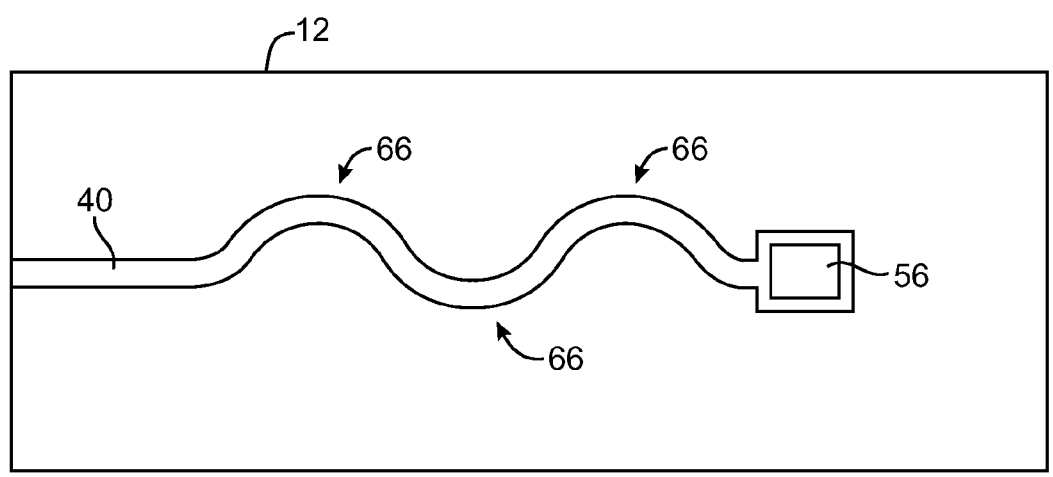
FIG. 15 is a top view of a printed circuit board showing how a wire channel may be provided with strain relief features in accordance with an embodiment of the present invention.

Openings 40 such as the openings that are used to receive wire 52 may be provided with bends, as shown by bends 66 in FIG. 15. Bends 66 may be provided in buried wire channels such as channel 40G of FIG. 7 or recessed grooves such as grooves 40E and 40F. Bends 66 may help retain wire 52 within printed circuit board 12 and may therefore serve as a strain relief structure.

It may be desirable to integrate the components that are embedded in printed circuit board 12 into printed circuit board 12. Component integration approaches may be used, for example, to reduce part counts, to minimize size, to improve environmental sealing, etc. With one suitable arrangement, switch structures such as dome switch structures can be integrated into board 12.

Figure 16:
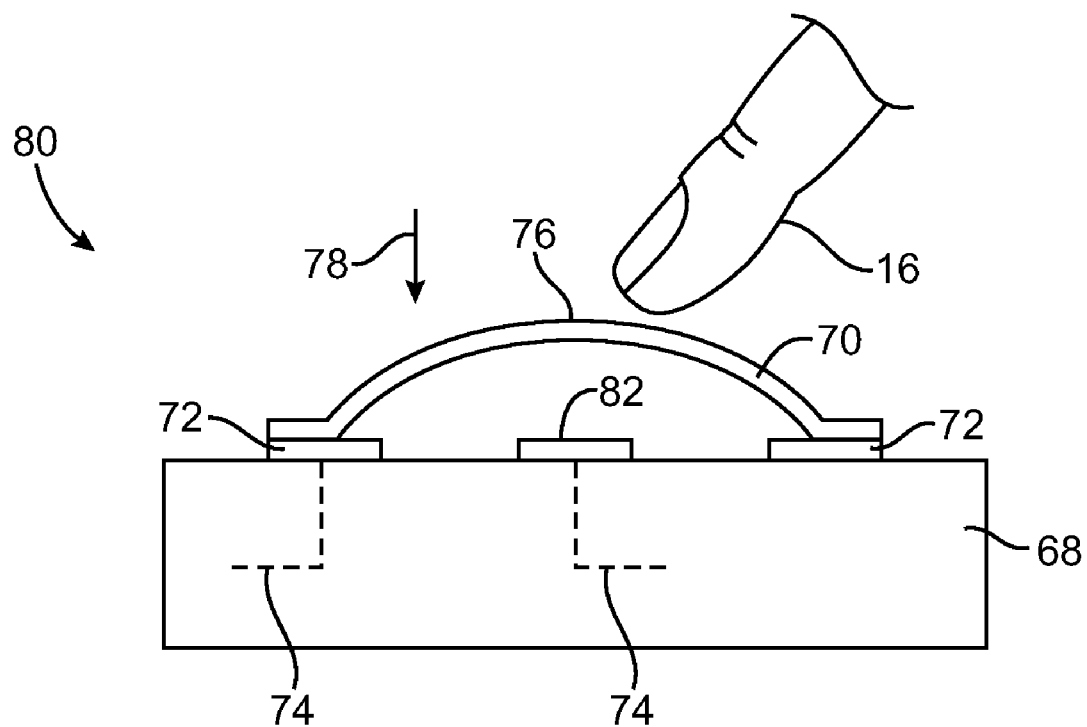
FIG. 16 is a cross-sectional side view of a conventional dome switch without a protective housing.

FIG. 16 is a cross-sectional side view of a conventional dome switch. Dome switch 80 has a dome member 70. Dome member 70 is mounted to the surface of circuit board 68. Central contact 82 forms a first switch terminal for dome switch 80. Ring-shaped outer contact 72 forms a second switch terminal for dome switch 80. Interconnects 74 (i.e., traces in board 68) are used to connect the switch terminals of dome switch 80 to circuitry that processes switch signals. When a user presses surface 76 of dome 70 in direction 78 with finger 16, dome 70 collapses. Dome 70 has a conductive inner surface. When dome 70 collapses, the conductive inner surface of dome 70 shorts terminals 72 and 82 together, thereby closing switch 80.

Figure 17:
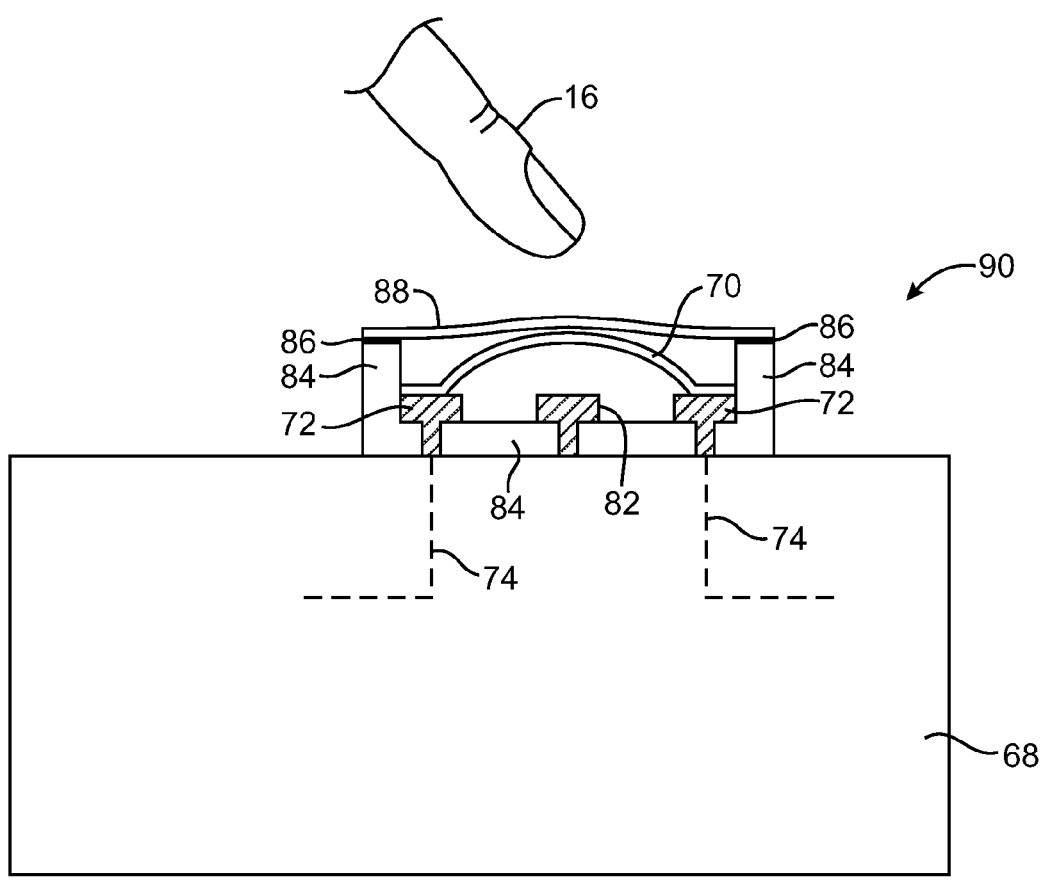
FIG. 17 is a cross-sectional side view of a conventional dome switch encased within a protective housing.

Dome switches such as dome switch 80 of FIG. 16 are generally not well sealed against environmental intrusions, so dust and moisture can adversely affect switch operation. To provide environmental sealing, dome switches are therefore sometimes enclosed within housings. A conventional dome switch that is packaged within a housing is shown in FIG. 17. As shown in FIG. 17, packaged dome switch 90 has a housing such as housing 84. Dome member 70 and contacts 72 and 82 may be housed within housing 84. Flexible cover 88 may be attached to the top of housing 84 using adhesive 86. Flexible cover 88 may help seal switch 90, while still allowing finger 16 to compress dome member 70 to actuate switch 90. However, the presence of housing walls 84 tends to add undesired bulk and height to dome switch 90.

Figure 18:
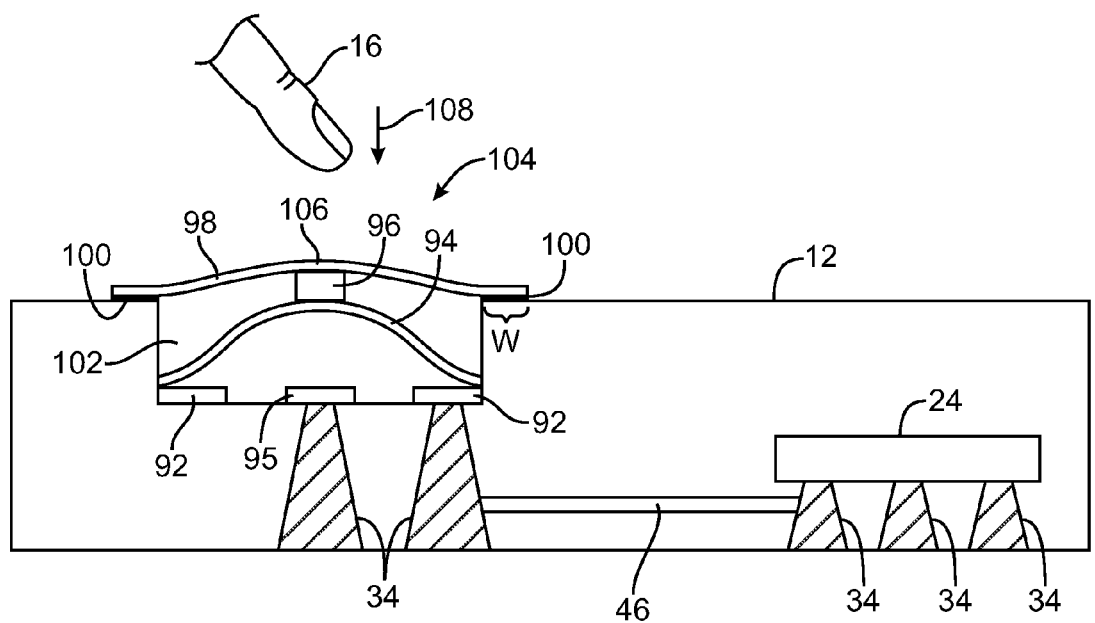
FIG. 18 is a cross-sectional side view of an illustrative printed circuit board with an integrated dome switch and embedded integrated circuit in accordance with an embodiment of the present invention.

A printed circuit board with an integrated dome switch is shown in FIG. 18. As shown in FIG. 18, printed circuit board 12 may be provided with a cavity such as dome switch opening 102 (e.g., a recess that penetrates only partway through board 12 and that has a bottom surface). Dome switch 104 may be integrated with printed circuit board 12 by mounting dome switch components directly within cavity 102 (e.g., without using a separate housing member to enclose these components).

Switch 104 may have contacts such as central contact 95 and ring-shaped outer contact 92. Contacts 95 and 92 may be formed from patterned conductive layers in printed circuit board 12 (e.g., patterned layers of conductor 32). Vias 34 (e.g., laser-formed vias) and horizontal interconnect structures 46 may form electrical connections with terminals 95 and 92 and may be used to interconnect terminals 92 and 95 with circuitry within integrated circuit 24 or other suitable circuitry. Dome switch 104 may have a dome member such as dome member 94. Dome member 94 may be formed from metal or may be formed from other substances (e.g., plastic) that have an inner conductive layer such as an inner layer of metal. Member 96, which may be formed from plastic, may be interposed between dome member 94 and cover 98. Cover 98 may be a rectangular or circular flexible sheet formed from plastic, polyimide, polytetrafluoroethylene, or other suitable polymers or flexible materials. Flexible member 98 may be sealed around its periphery to the upper surface of printed circuit board 12 using adhesive 100. The width W of adhesive 100 about the periphery of flexible layer 98 may be, for example, about 0.5 to 5 mm (as an example). When a user presses downwards on surface 106 of flexible cover 98, member 96 and dome 94 are pressed downwards in direction 108. When dome 94 is compressed, its inner conductive surface shorts contacts 95 and 92 together, thereby closing switch 104. Because of the presence of the peripheral seal around the periphery of flexible member 98, switch 104 may be well sealed against the environment. Flexible member 98 may therefore help prevent the intrusion of dust and moisture into switch cavity 102 and under dome member 94.

Figure 19:
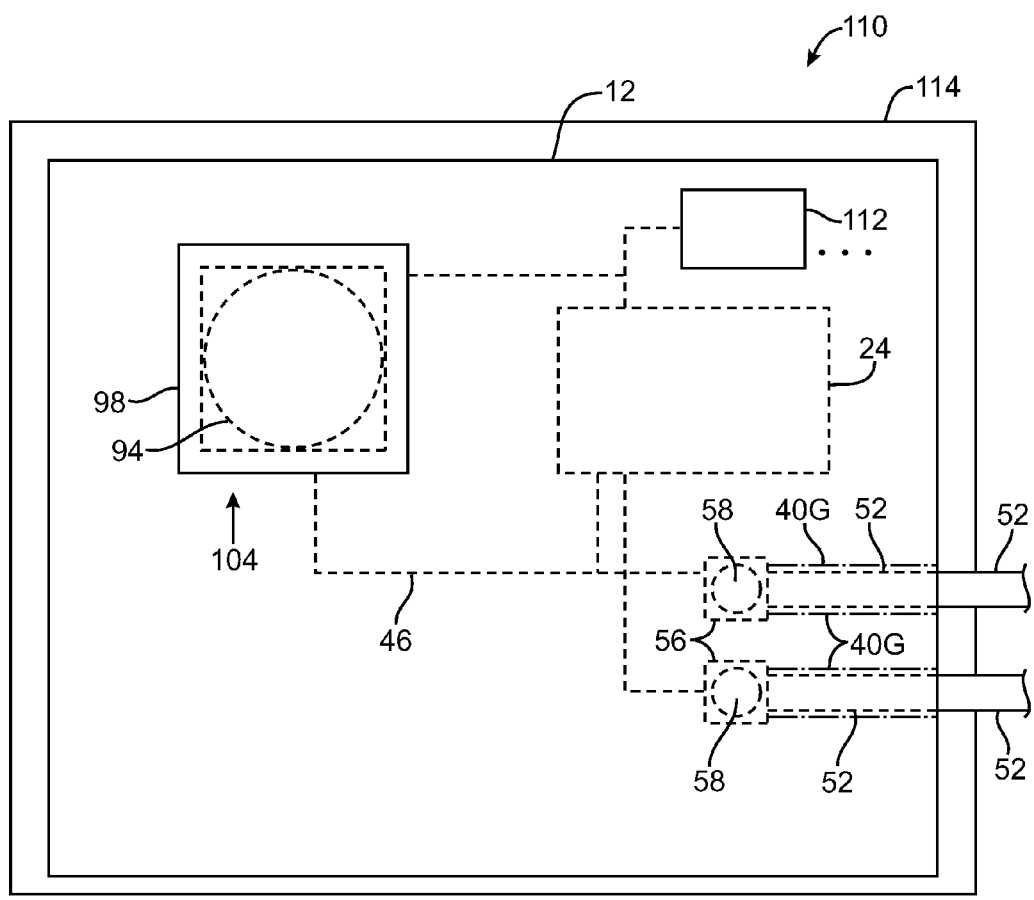
FIG. 19 is a top view of an illustrative electronic device that includes a printed circuit board with embedded components in accordance with an embodiment of the present invention.

Printed circuit boards 12 may be used in any suitable electronic device such as an electronic accessory (e.g., a headset with speakers and a microphone), a cellular telephone, a tablet computer, a portable computer, a pendant device, a portable music player, a handheld device, a wristwatch device, etc. FIG. 19 is a top view of an illustrative electronic device that may include a printed circuit board with embedded components. As shown in FIG. 19, electronic device 110 may have a housing such as housing 114 that encases printed circuit board 12. Printed circuit board 12 may include surface mount technology (SMT) components, discrete components such as capacitors, resistors, inductors, and connectors, and may include integrated circuits. Components such as switches, speakers, sensors, light-emitting diodes, microphones, and other devices may be mounted on printed circuit board 12 (e.g., using solder pads, wire bonding, ball-grid array packaging, and other suitable mounting techniques). Preferably, at least some of the devices that are mounted on printed circuit board 12 may be embedded in printed circuit board 12. In the example of FIG. 19, printed circuit board 12 includes an integrated (and embedded) dome switch (switch 104), embedded wires 52 with recessed (embedded) solder pads 56 and solder 58, embedded integrated circuit (circuit 24), and additional embedded components 112 (e.g., an embedded microphone with an associated acoustic port opening within board 12, an embedded speaker, an embedded tact switch, other components, multiple components of these types, etc.). These embedded components may be formed within openings 40 in printed circuit board 12 and may be interconnected using interconnects 46 (e.g., horizontal interconnects and vias).

Figure 20:
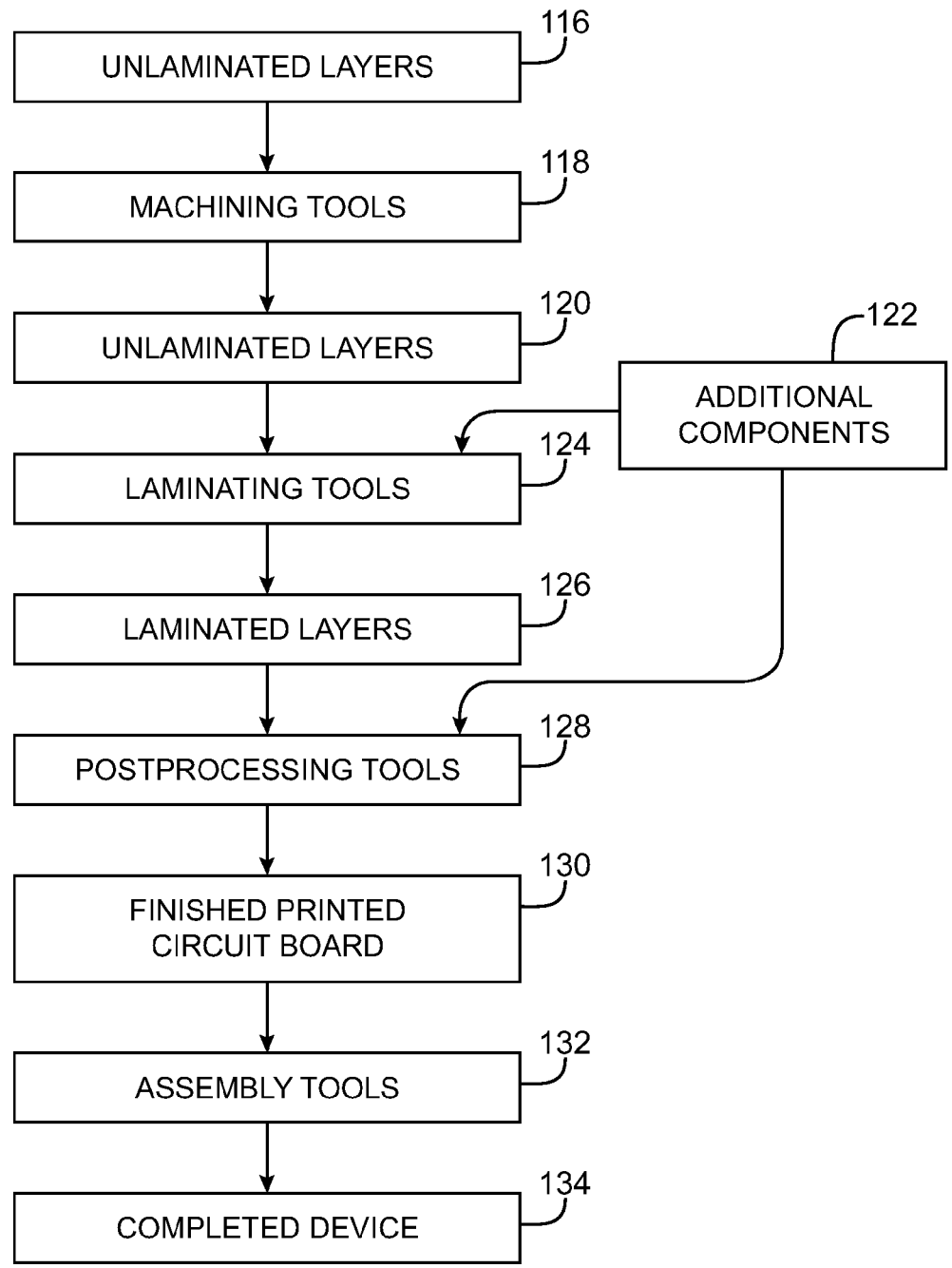
FIG. 20 is a flow chart of illustrative steps involved in forming printed circuit boards with embedded components in accordance with an embodiment of the present invention.

Illustrative steps and equipment involved in forming printed circuit boards with embedded components are shown in FIG. 20. As shown in FIG. 20, unlaminated (individual) layers 116 of core and prepreg printed circuit board material may be obtained and provided to machining tools 118. Machining tools 118 may include mechanical tools such as mechanical drilling and milling tools and stamping tools. Machining tools 118 may also include laser drilling tools. Tools 118 may be used to form openings 40 in one or more of printed circuit board layers 116, producing patterned unlaminated printed circuit board layers 120. Openings may pass completely though layers 120 or may pass partially through each layer 120.

Layers 120 may be patterned (e.g., the conductive layers on the surfaces of layers 120 may be patterned using screen printing, etching, etc.). Patterned layers 120 may be laminated using laminating tools 124. During the lamination process, components may be embedded within some of openings 40. For example, wires 52 may be enclosed within buried channels in printed circuit board 12, integrated circuit 24 may be encased within an interior cavity 40 in printed circuit board 12, components may be embedded in recesses that pass partway through board 12, etc.

The lamination process results in a laminated printed circuit board (i.e., a printed circuit board substrate having laminated layers 126). Printed circuit board 126 may be processed using post-processing tools 128 (e.g., board 126 may be machined using machining tools such as tool 118 to form openings, solder connections may be formed using soldering tools, processing may be performed using other tools, etc.). Additional components may be incorporated into board 12 (e.g., additional components such as switch components may be added to a well-shaped recess that was machined partway into the laminated layers using tools 128, etc.). After all desired embedded components have been incorporated into laminated layers 126, the printed circuit board is complete (i.e., finished printed circuit board 130 has been produced). Assembly tools 132 may be used to attach board 130 to other system components and may be used to mount board 130 into a device housing to produce completed device 134.

Printed circuit board 12 may contain one or more support structures such as structure 140 that provide mechanical support for embedded components such as switch 104. Structure 140 may help to increase the durability and reliability of printed circuit boards 12 that include embedded components. Structure 140 may be referred to herein as a stiffener or a stiffening component. Structure 140 may be formed from materials such as metal, copper, steel, aluminum, plastics, ceramics, glass, etc.

Support structure 140 may include a planar member (e.g., a metal sheet) such as head 142 and an optional shaft 144. Head 142 of structure 140 may have a relatively large area that spreads force out over printed circuit board 12 so that head 142 of structure 140 is mechanically grounded to printed circuit board 12. Shaft 144 of structure 140 may mechanically ground embedded components such as switch 104 to head 142 of structure 140 and to printed circuit board 12. Head 142 and shaft 144 of structure 140 may be mechanically connected to printed circuit board 12 and component 104 with adhesive, welds, fasteners such as screws, clips, and springs, with other attachment mechanisms, or with combinations of these arrangements. If desired, shaft 144 can be omitted.

Figure 21:
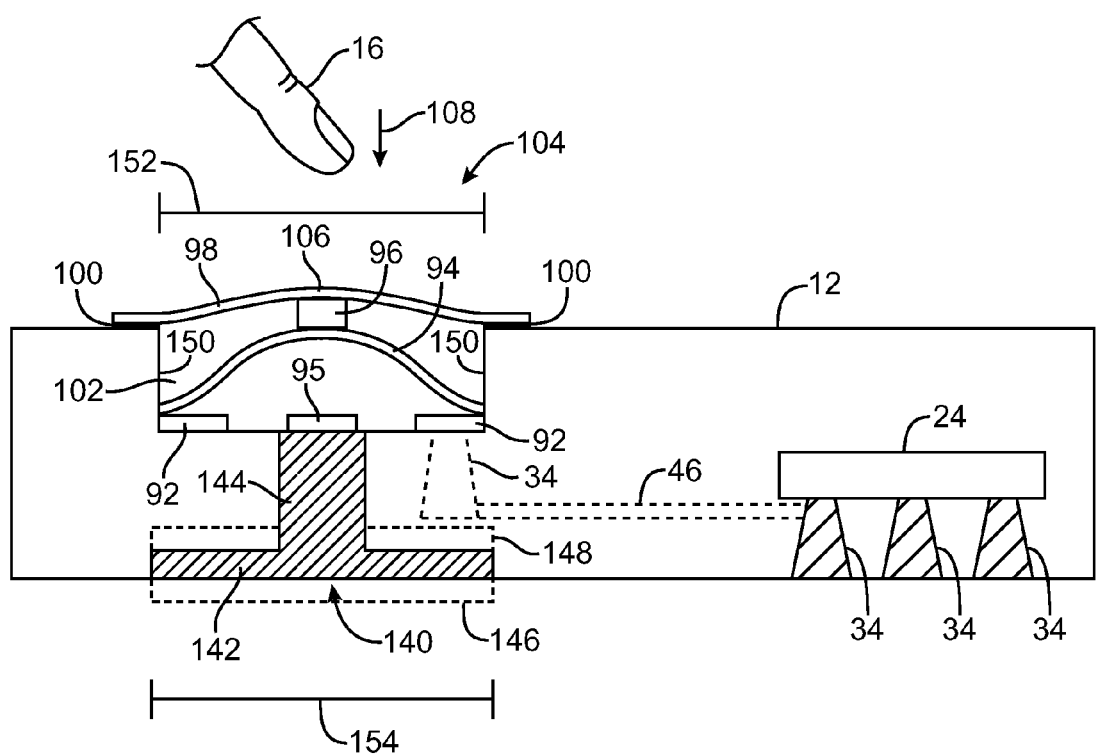
FIG. 21 is a cross-sectional side view of an illustrative printed circuit board with an integrated dome switch and embedded integrated circuit that may include a stiffener in accordance with an embodiment of the present invention.

As shown in FIG. 21, head 142 of structure 140 may be flush mounted in printed circuit board 12. If desired head 142 of structure 140 may be embedded in printed circuit board 12 as shown by dotted outline 148. With another suitable arrangement, head 142 of structure 140 may be mounted to an exterior surface of printed circuit board 12 as shown by dotted outline 146.

Structure 140 may extend over lateral dimensions such as lateral dimension 154 and component 104 may extend over lateral dimensions such as lateral dimension 152. As examples, lateral dimension 154 may be less than approximately one-half of dimension 152, less than approximately three-quarters of dimension 152, less than approximately equal to dimension 152, less than approximately one and a quarter times dimension 152, less than approximately one and a half times dimension 152, less than approximately one and three quarter times dimension 152, less than approximately two times dimension 152, less than approximately two and a half times dimension 152, or less than approximately three times dimension 152. With these types of arrangements, support structure 140 may provide mechanical support and stiffening of printed circuit board 12 in the vicinity of embedded component 104 without stiffening portions of printed circuit board 12 away from component 104 (e.g., without stiffening portions of board 12 that are not adjacent to component 104).

If desired, printed circuit board 12 may include an encapsulant such as encapsulant 150 on the perimeter of opening 102. With this type of arrangement, cover 98 and encapsulant 150 may form a moisture-proof seal (i.e., a moisture-blocking recessed liner) that protects embedded components such as switch 104 from moisture.

Figure 22A:
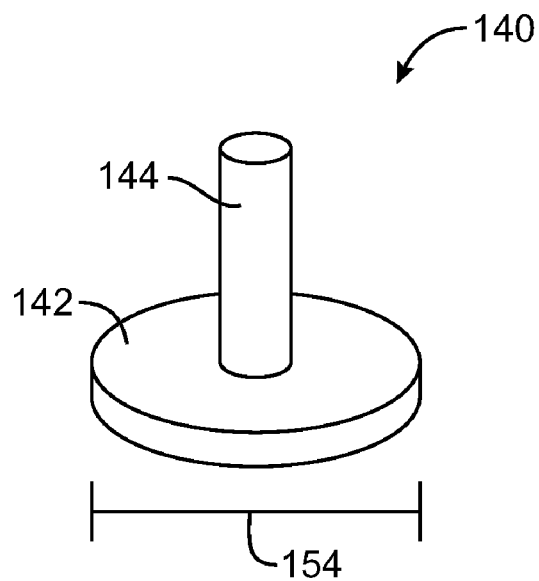
FIGS. 22A and 22B are perspective views of illustrative stiffeners that may provide mechanical support for a dome switch that is integrated into a printed circuit board of the type shown in FIG. 21 in accordance with embodiments of the present invention.
Figure 22B:
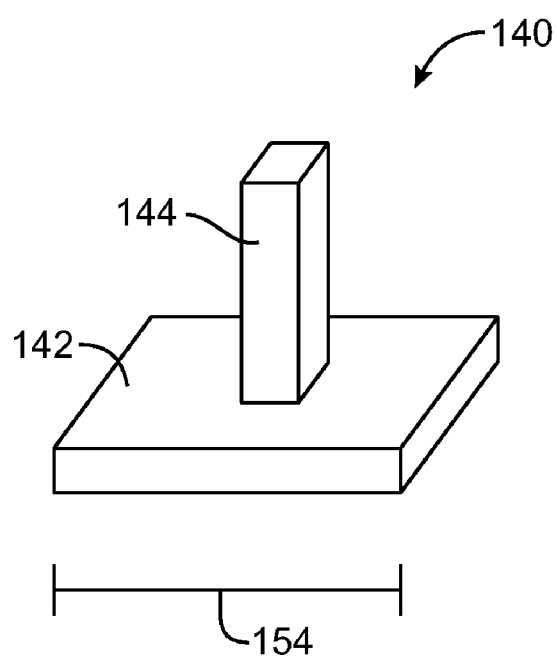

FIGS. 22A and 22B illustrate examples of support structure 140. In the example of FIG. 22A, head 142 and shaft 144 of support structure are circular. In the example of FIG. 22B, head 142 and shaft 144 of support structure are rectangular. These are merely examples and, in general, support structure 140 may have other shapes. If desired, shaft 144 may be the same size as or even larger than head 142.

The foregoing is merely illustrative of the principles of this invention and various modifications can be made by those skilled in the art without departing from the scope and spirit of the invention.

What is claimed is:

1. A printed circuit board, comprising:
   a printed circuit board substrate having an opening that passes only partway through the printed circuit board substrate;
   an integrated dome switch formed in the opening; and
   an integrated circuit embedded within an interior cavity within the printed circuit board substrate.

2. The printed circuit board defined in claim 1 wherein the opening comprises a well-shaped opening in a surface of the printed circuit board substrate and wherein the integrated dome switch comprises a dome member in the well-shaped opening.

3. The printed circuit board defined in claim 2 wherein the integrated dome switch further comprises a flexible sheet that covers the dome member.

4. The printed circuit board defined in claim 3 further comprising adhesive that seals the flexible sheet to the printed circuit board substrate around the well-shaped opening.

5. The printed circuit board defined in claim 1 further comprising vias that form electrical connections with the integrated circuit.

6. The printed circuit board defined in claim 2 further comprising switch terminals that are shorted together by the dome member when the dome member is compressed.

7. The printed circuit board defined in claim 6 further comprising laser-formed vias that form electrical connections with the switch terminals.

8. The printed circuit board defined in claim 2 wherein the printed circuit board substrate comprises:
   a recess; and
   a solder pad in the recess.

9. The printed circuit board defined in claim 1 further comprising:
   a recess in the printed circuit board substrate; and
   a solder pad in the recess.

10. A printed circuit board, comprising:
    a printed circuit board substrate having an opening that passes only partway through the printed circuit board substrate;

an integrated dome switch formed in the opening;
a recess in the printed circuit board substrate;
a solder pad in the recess; and
a wire soldered to the solder pad.

11. The printed circuit board defined in claim 10 further comprising a buried channel in the printed circuit board substrate, wherein the wire passes through the buried channel.

12. The printed circuit board defined in claim 10 further comprising a groove in the printed circuit board substrate, wherein the wire is located in the groove.

13. A printed circuit board, comprising:
a printed circuit board substrate having an opening that passes only partway through the printed circuit board substrate;
an integrated dome switch formed in the opening, wherein the opening has a depth and has lateral dimensions perpendicular to the depth of the opening; and
a support structure that has lateral dimensions that are less than three times the lateral dimensions of the opening and that mechanically connects the integrated dome switch to the printed circuit board substrate.

14. The printed circuit board defined in claim 13 wherein the support structure comprises:
a planar member that is at least partly embedded in the printed circuit board substrate; and
a shaft that has a first end that is connected to the planar member, that extends through the printed circuit board substrate, and that has a second end that is connected to the integrated dome switch.

15. A printed circuit board, comprising:
a printed circuit board substrate having an opening that passes only partway through the printed circuit board substrate;
an integrated dome switch formed in the opening; and
a stiffener that stiffens portions of the printed circuit board substrate under the integrated dome switch.

16. The printed circuit board defined in claim 15 wherein the stiffener comprises a planar metal member.

17. A printed circuit board, comprising:
a printed circuit board substrate having an opening that passes only partway through the printed circuit board substrate;
an integrated dome switch formed in the opening, wherein the integrated dome switch comprises:
a dome member; and
at least one switch terminal that is shorted together by the dome member when the dome member is compressed;
an integrated circuit embedded within an interior cavity within the printed circuit board substrate; and
at least one via that forms an electrical connection between the at least one switch terminal and the integrated circuit.

18. The printed circuit board defined in claim 17, wherein the integrated dome switch further comprises a flexible sheet that covers the dome member.

19. The printed circuit board defined in claim 17, further comprising:
a recess in the printed circuit board substrate; and
a solder pad in the recess.

* * * * *